United States Patent [19]

Iwamatsu

[11] Patent Number: 5,258,219
[45] Date of Patent: Nov. 2, 1993

[54] OPTIMIZED THIN FILM METAL INTERCONNECTS IN INTEGRATED CIRCUIT STRUCTURES OF APPARATUS TO REDUCE CIRCUIT OPERATIONAL DELAY

[75] Inventor: Seiichi Iwamatsu, Suwa, Japan

[73] Assignee: Seiko Epson Corporation, Tokyo, Japan

[21] Appl. No.: 891,608

[22] Filed: Jun. 1, 1992

Related U.S. Application Data

[63] Continuation-in-part of Ser. No. 759,786, Sep. 9, 1991, Pat. No. 5,119,170, which is a continuation of Ser. No. 461,693, Jan. 8, 1990, abandoned.

[51] Int. Cl.$^5$ ................................ B32B 9/00
[52] U.S. Cl. .................... 428/209; 428/901; 428/195
[58] Field of Search ................ 428/209, 901, 195

Primary Examiner—Patrick J. Ryan
Assistant Examiner—Kam Lee
Attorney, Agent, or Firm—W. Douglas Carothers, Jr.

[57] ABSTRACT

Thin film metal interconnects employed in integrated circuit structures have a width, L, and a spatial separation or spacing, S, according to the following characteristics: interconnect width, $L \geq 0.1$ μm; interconnect spatial separation, $S \geq 0.2$ μm, interconnect thickness, $T_{A1} \leq 2L$ μm; and interlayer insulating film thickness, $T_I \leq 2L$ μm. More particularly, the layout is characterized by having the ranges of $0.1 \leq L \leq 0.8$ μm and $0.2\ \mu m \leq S \leq 1\ \mu m$. As a result, IC signal switching speed is optimized for IC's designed in the submicron integration scale regime.

5 Claims, 2 Drawing Sheets

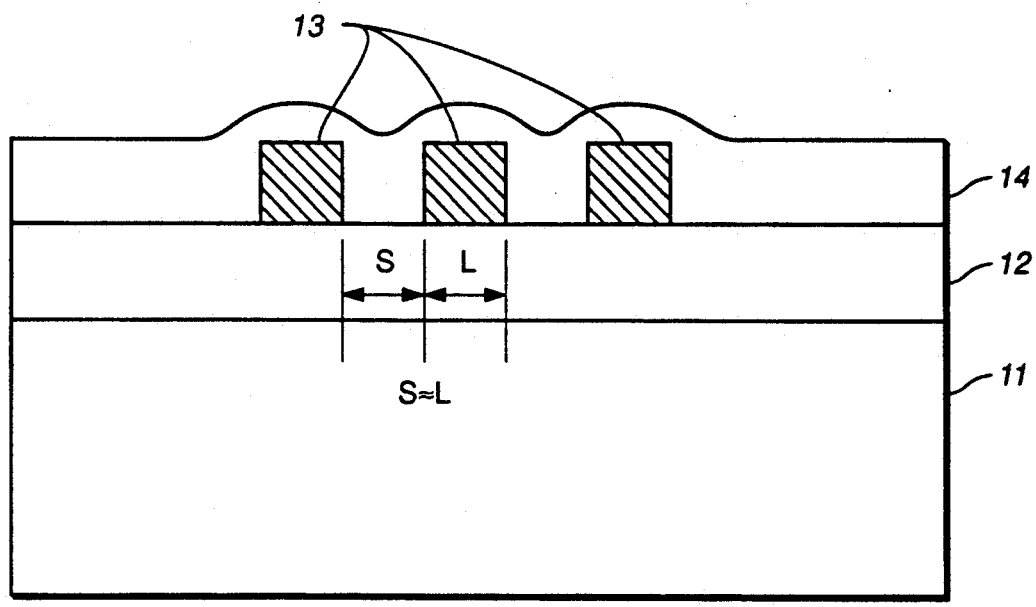
FIG._1
*(PRIOR ART)*
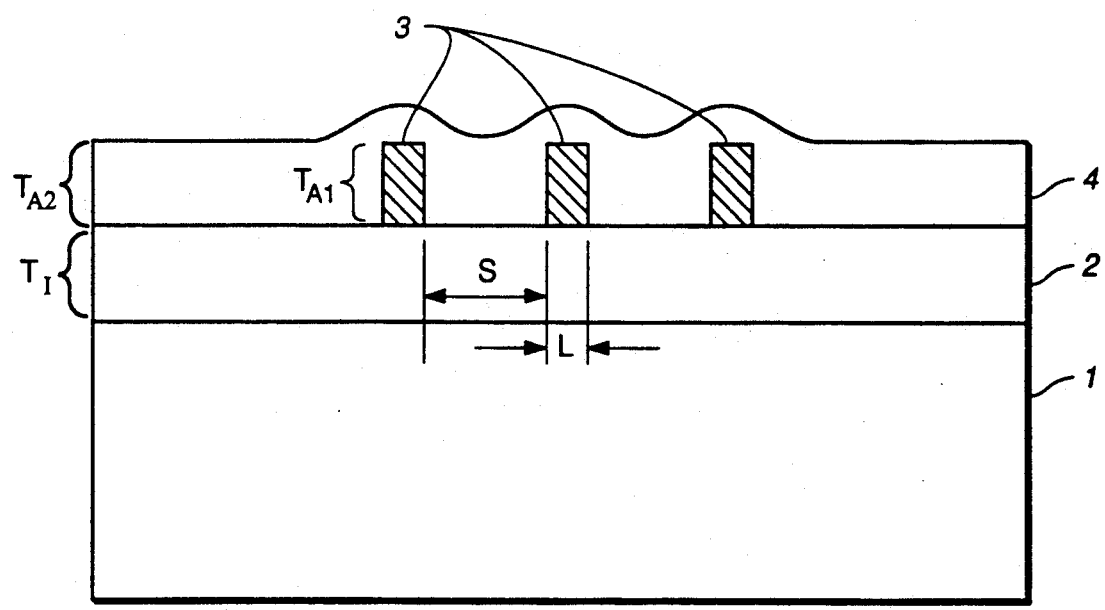
FIG._2

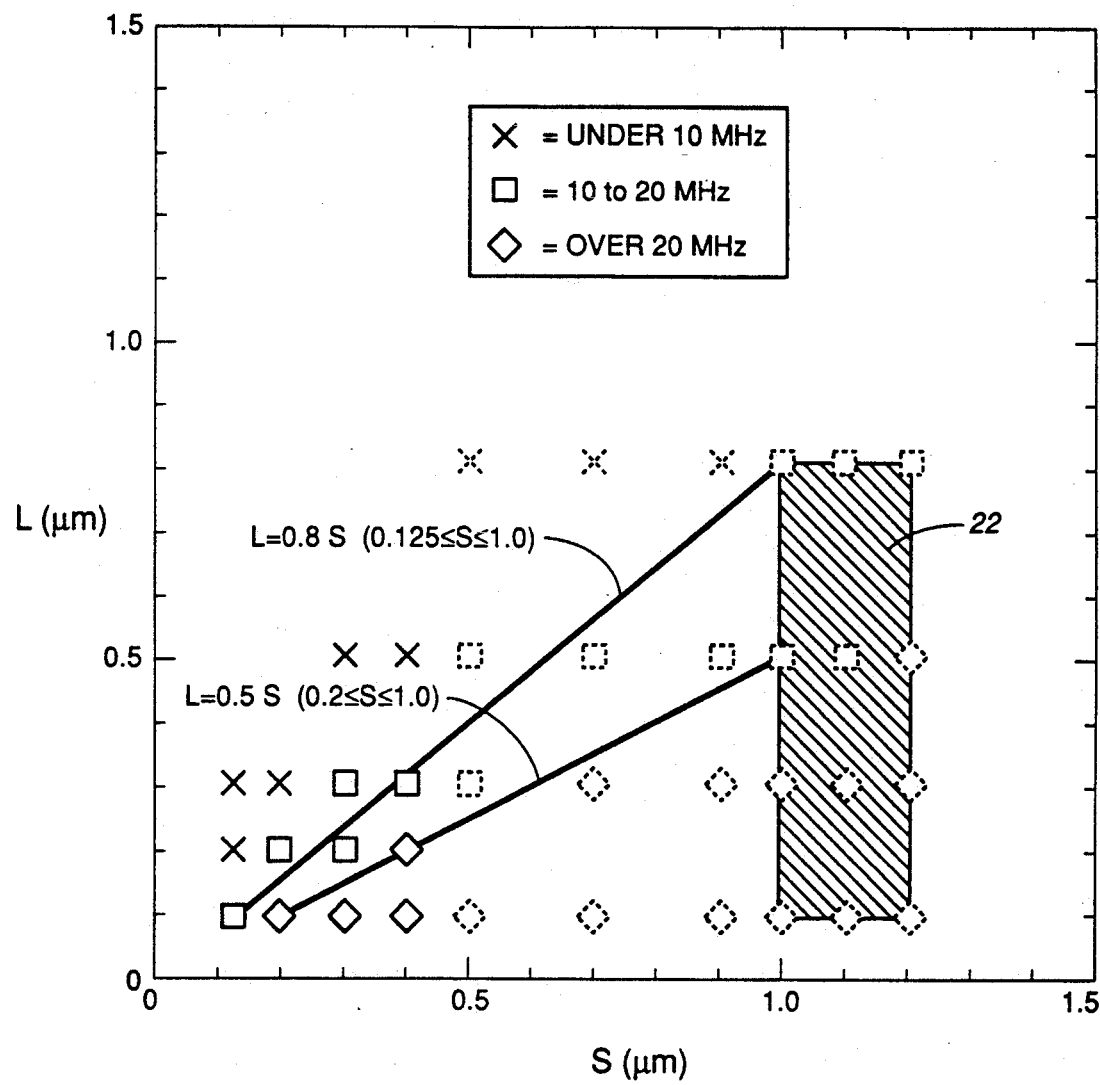
FIG._3

OPTIMIZED THIN FILM METAL INTERCONNECTS IN INTEGRATED CIRCUIT STRUCTURES OF APPARATUS TO REDUCE CIRCUIT OPERATIONAL DELAY

BACKGROUND OF THE INVENTION

This is a continuation-in-part of patent application Ser. No. 07/759,786, now U.S. Pat. No. 5,119,170 filed Sep. 9, 1991 which is a continuation of patent application Ser. No. 07/461,693, now abandoned. Filed Jan. 8, 1990.

This invention relates generally to a method and apparatus of wiring line or metal interconnect design layout in integrated circuit structures employed in apparatus and more particularly to the employment of an unique interconnect layout rule to reduce spatial interconnect capacitance thereby improving integrated circuit operational speed and performance.

It is the general practice in the fabrication of metal interconnects or electrode lines in integrated circuit structures to provide the finished measurements of lines, L, and spacing, S, to be approximately equal to each other, i.e., $L \approx S$. In current practice, this scale relationship in integrated circuit design has been 1 $\mu$m or less so that L plus S is equal to 2.0 $\mu$m or less. As an example, in FIG. 1, a portion of an integrated circuit structure is shown, such as, in the case of interconnects comprising insulating film 12, such as $SiO_2$, formed on Si semiconductor substrate 11. Thin film metal interconnects 13 comprising Al, Al alloy or the like are formed on the $SiO_2$ film 12. The relation among the interconnects 13 is of substantially equal width, L, and spatial separation, S, i.e., $L \approx S$. Lastly, an insulating film 14, such as $SiO_2$ formed by CVD, is deposited on interconnects 13 to function as an interlayer dielectric or passivation film. In integrated circuit structures such as shown in FIG. 1 are generally designed according to applicable minimum and maximum design layout rules wherein the spatial separation of metal interconnects is usually determined by the smallest spacing that can be patterned into the metalization.

In these prior art interconnect structures, there exists the problem of delay in circuit operation speed due to the increase in number of interconnects as well as the density thereof because of reduced integration scale. In particular, as the integration scale has increasingly become smaller, the measurement of interconnect width and spatial separation are each equal to or less than 1 $\mu$m. As a result, spatial capacitance of interconnects significantly increases and becomes a dominant factor affecting signal propagation delay and switching speed of integrated circuits. Interconnect capacitance has a major effect on operation speed of logic circuitry since it functions as a load. As a result, there is an increase in signal delay or signal propagation delay time and a reduction in signal switching time due to these interconnects. What is needed is a new approach to forming metal interconnects to reduce this increase in capacitance load caused by large scale integration into the sub-micron range together with increases in interconnect density.

It is an object of the present invention to provide a layout method for thin film metal interconnects in integrated circuit structures without experiencing an increase in circuit operation speed delay, even in cases where the width and spatial separation is reduced respectively below 0.8 $\mu$m and 1 $\mu$m.

SUMMARY OF THE INVENTION

According to this invention, a method for thin film metal interconnect layout in integrated circuit structures to reduce operational speed delay is disclosed wherein the interconnect width, L, and interconnect spatial separation or spacing length, S, wherein $L \geq 0.1$ $\mu$m, $S \geq 0.2$ $\mu$m, interconnect thickness, $T_{Al} \leq 2\,L$ $\mu$m and the interconnect interlayer insulating film, $T_I$, $\leq 2\,L$ $\mu$m. More particularly, the layout is characterized by having preferred ranges of $0.1\,\mu m \leq L \leq 0.8\,\mu m$ and $0.2\,\mu m \leq S \leq 1\,\mu m$. In particular, the preferred range for interconnect width, L, is $0.1\,\mu m \leq L \leq 0.8\,S\,\mu m$ and most preferably $0.1\,\mu m \leq L \leq 0.5\,S\,\mu m$. By incorporating the layout rule of this invention, particularly in the sub-micron range of large scale integration, circuit operation speed delay, which is always associated with design rule scaling of integrated circuit devices and structural components, may be substantially reduced, if not effectively eliminated, providing for an optimized combination of high density and high speed integrated circuit structures.

Further, this invention comprises a method of forming thin film metal interconnects employed in integrated circuit structures particularly suited in the sub-micron integration scale regime comprising the step of laying out the interconnects so that the patterned interconnects have an interconnect line width, L, preferably equal to or less than 0.8 $\mu$m and equal to or greater than 0.1 $\mu$m, i.e., in the range of $0.1\,\mu m \leq L \leq 0.8\,\mu m$ with spatial separation, S, of the interconnects in the range of 0.2 $\mu$m to 1 $\mu$m, i.e., in the range of $0.2\,\mu m \leq S \leq 1.0\,\mu m$, with interconnect thickness, $T_{Al}$, equal to about 2·L, more specifically, in the range of $0.5\,L\,\mu m \leq T_{Al} \leq 2\,L$ $\mu$m, thereby resulting in an overall optimized improvement range in the overall operational speed of a sub-micron IC structure with optimized reduction in spatial capacitance between interconnects. Furthermore, it has been found that the thickness of the interlayer insulating film of the interconnects is preferably in the range of $0.5\,L\,\mu m \leq T_I \leq \mu m$.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a cross sectional view of a portion of an integrated circuit structure illustrating the employed standard interconnect layout rule of $L \approx S$.

FIG. 2 is a cross sectional view of a portion of an integrated circuit structure illustrating the novel interconnect layout of this invention.

FIG. 3 is a graphic illustration of the preferred ratio range of interconnect width, L, versus spatial separation, S, in microns.

DESCRIPTION OF THE PREFERRED EMBODIMENTS

Reference is now made to FIG. 2 which illustrates a portion of a semiconductor integrated circuit structure to illustrate the interconnect layout rule of this invention. In FIG. 2, the integrated circuit structure comprises interlayer insulating film 2, e.g., $SiO_2$, formed on the surface of Si semiconductor substrate 1. Then, thin film metal interconnects 3 comprising, for example, Al, W, Cu, Al alloy or the alloy Cu-Si-Mg are formed on the surface of SiO$_2$ film 2 such as by conventional processing techniques, for example, depositing a first layer of metal, photo-patterning the metal and etching the metal to form interconnects 3. Film 2 functions as the interlayer insulating film between conductive substrate 1 and conductive interconnects 3. A capacitance is created between interconnects 3 and substrate 1 which affects the circuit operational speed. Compared to interconnects 3 of Al, interconnect made of W, Cu, Al alloy or the alloy Cu-Si-Mg are desirable from the standpoint of preventing migration. Interconnects 3 are, then, covered with an insulating film 4, e.g., SiO$_2$, which may be deposited by CVD. Upper film 4 functions as an interlayer dielectric isolation or passivation film.

Interconnects 3 have a width, L, and a spatial separation or spacing length, S, a height or thickness, $T_{Al}$, and an interlayer insulating film 2 thickness, $T_I$, according to the following characteristics: $L \geq 0.1$ μm, $S \geq 0.2$ μm, $0.1$ μm $\leq L \leq 0.8$ S μm, $0.5$ L μm $\leq T_{Al} \leq 2$ L μm, and $0.5$ μm $\leq T_I \leq 2$ L μm. More particularly, the layout is characterized by having preferred ranges for L and S, respectively, of $0.1$ μm $\leq L \leq 0.5$ S μm and $0.2$ μm $\leq S \leq 1.0$ μm.

Interconnect width, L, need not always be specifically between the range of 0.1 μm and 0.8 μm but may be larger than 0.8 μm but not larger than 1.0 μm. The layout rule must take into consideration multilayer interconnections. When L becomes larger than 1.0 μm, spatial capacitance between a silicon substrate and an upper layer interconnect, for example, becomes undesirably larger and, as a result, propagation time, $t_P$, becomes significantly longer. Spatial separation, S, is either equal to or greater than 0.2 μm.

Reference is made to FIG. 3 which graphically illustrates the relationship between interconnect width, L, and interconnect spatial separation, S. The cross-hatched area 22 represents the region set forth in U.S. Pat. No. 5,119,170, to wit, S preferably between 1.0 μm-1.2 μm and L preferably between 0.1 μm and some value below 1.0 μm. However, I have discovered that this range is larger than the cross hatched area and is extendible to a minimum wherein S=0.2 μm and L=0.1 μm, as illustrated in FIG. 3. The areas of L to S values marked "X" provided for circuit signal switching speeds under 10 MHz, the areas marked " " provide for circuit signal switching speeds in the range of about 10 MHz to 20 MHz and the areas marked " " provided for circuit signal switching speeds over 20 MHz.

For better understanding of this invention, Table I below illustrates differences in signal switching speed in terms of frequency relative to the relationship between interconnect width, L, and interconnect spatial separation, S. Although signal switching speed differs depending upon the given driving voltage on the interconnects, the structure of the interconnects as well as the connected circuit components and their corresponding impedances, the following can be considered as a general guideline relative to these relationships.

The data set forth in Table I shows various examples relative to relationships for interconnect spatial separation, S, width, L, and thickness, $T_{Al}$. Also, as in the case of FIG. 3, signal switching speed is shown for each sample in relationship to frequency range wherein the symbol "X" represents a switching speed in the range of 10 MHz or less, the symbol " " represents a switching speed in the range of 10 to 20 MHz and the symbol " " represents a switching speed in the range of 20 MHz or more. These symbols in Table I are shown in dotted outline in FIG. 3.

TABLE I

| Example No. | S (μm) | L (μm) | Signal Switching Speed | Thickness of Interconnects, $T_{Al}$ (μm) |
|---|---|---|---|---|
| 1 | 0.5 | 0.8 | x | 0.1-0.5 |
| 2 | 0.5 | 0.5 | | |
| 3 | 0.5 | 0.3 | | |
| 4 | 0.5 | 0.1 | | |
| 5 | 0.7 | 0.8 | x | 0.1-0.7 |
| 6 | 0.7 | 0.5 | | |
| 7 | 0.7 | 0.3 | | |
| 8 | 0.7 | 0.1 | | |
| 9 | 0.9 | 0.8 | x | 0.2-0.9 |
| 10 | 0.9 | 0.5 | | |
| 11 | 0.9 | 0.3 | | |
| 12 | 0.9 | 0.1 | | |
| 13 | 1.0 | 0.8 | | 0.2-1.0 |
| 14 | 1.0 | 0.5 | | |
| 15 | 1.0 | 0.3 | | |
| 16 | 1.0 | 0.1 | | |
| 17 | 1.1 | 0.8 | | 0.2-1.0 |
| 18 | 1.1 | 0.5 | | |
| 19 | 1.1 | 0.3 | | |
| 20 | 1.1 | 0.1 | | |
| 21 | 1.2 | 0.8 | | 0.2-1.0 |
| 22 | 1.2 | 0.5 | | |
| 23 | 1.2 | 0.3 | | |
| 24 | 1.2 | 0.1 | | |

Recently, anistropy etching techniques have advanced sufficiently to enable the formation of interconnects with smaller width compared to their thickness, $T_{Al}$, thus enabling, for example, conditions for Example Nos. 3, 4, 7, and 8 in Table I to be accomplished in practical use. If spatial separation, S, between interconnects 3 is large, then capacitance, C, will become small, and signal switching times will become shorter with a corresponding increase in signal switching speed. If interconnect width, L, is small, capacitance, C, between the top and bottom surfaces of interconnects 3 will be reduced and, therefore, the signal switching speed will be increased. If the thickness, $T_{Al}$, of interconnects 3 is small, however, the capacitance between neighboring or adjacent interconnects will become smaller and, therefore, the signal switching speed will be increased. Further, interconnect resistance, R, increases as the cross sectional area of interconnects decreases, reducing signal switching speed. Therefore, in order not to decrease cross sectional area of interconnects 3 and thereby increase their resistance, it is preferred that the thickness, $T_{Al}$, of interconnects be retained around 0.5 μm. This is because high values of $T_{Al}$ or high ratio values of $T_{Al}/L$ provide for very thin and high interconnect structures which are difficult to fabricate or realize from a practical point of view under the present state of the art.

When insulating films 2 and 4 are a SiO$_2$ film, the dielectric constant is about 3.9. In the case of use of a polyimide film 4, the dielectric constant is about 3.0. In the case of use of a Si$_3$N$_4$ film, the dielectric constant is about 9. It is preferable in the practice of this invention to use a material of low dielectric constant in order to lower the electrical capacitance between the interconnects. Ideally, the use of air as an isolation medium is the best because it has a dielectric constant of about 1. However, air is not practical and, therefore, typically a SiO$_2$ film or a polyimide film, whose dielectric constants are fairly low have been employed as a material for encapsulating interconnects 3. When the dielectric constant is about 3 and the interconnect spatial separation, S, is below 1.0 μm, the degree of circuit delay, which is due to an increase in electrical capacitance between adjacent interconnects, becomes larger.

Signal switching speed, $S_p$, is limited by the capacitance of the interconnect line and is proportionate to the reciprocal of the signal switching time or propagation delay time, $t_p$. The propagation delay time is expressed as follows:

$$S_P = (1/t_p) \propto (1/C \cdot R) \quad (1)$$

where C represents the capacitance of interconnects and R presents the resistance of interconnects. Capacitance, C, is proportionate to the product of interconnect width, L, and interconnect thickness $T_{A1}$, and inversely proportional to the spatial separation, S, between interconnects 3 and is expressed as follows:

$$C \propto L \cdot T_{A1}/S \quad (2)$$

Thus, an increase or decrease in spatial capacitance is directly proportional to a decrease or increase, respectively, in circuit delay.

Furthermore, resistance, R, of interconnects 3 is proportionate to a reciprocal number of the cross sectional area of interconnects 3. Therefore, when design layout is considered in the sub-micron region of large scale integration, the magnitude of increase in capacitance, C, dominates over the magnitude of increase in resistance, R, and thereby reducing circuit signal switching speed.

Also, there is a valuable relation relative to the thickness of the interlayer insulating film, $T_I$, and the ratio of L/S in addition to the width, L and the thickness, $T_{A1}$, of the interconnects. This can be explained as follows.

The spatial capacitance possessed by the IC interconnects is divided relative to two different directional components: the horizontal direction, $C_h$, and the vertical direction, $C_v$. The spatial capacitance in the horizontal direction, $C_h$, is represented as follows:

$$C_h \propto l_h T_{A1}/S \quad (3)$$

wherein $l_h$ is the length of interconnect along which interconnects 3 are in spatial proximity to one another by the distance of spatial separation, S. The spatial capacitance in the vertical direction, $C_v$, is represented as follows:

$$C_v \propto l_v L/T_I \quad (4)$$

wherein $l_v$ is the length of interconnect along which interconnects 3 are in spatial proximity to one another and spatially separated, either from other multilayer interconnects formed above film 4 indicated by the distance $T_{A2}$, the thickness of interlayer insulating film 4, or from semiconductor substrate 1 through film 2 indicated by the distance, $T_I$, the thickness of interlayer insulating film 2. In general practice, the length of $l_h$ is greater than the length of $l_v$ usually by a value of two times, i.e., $l_h > l_v$ generally by the value of 2.

There are optimum limitations in range relative to spatial separation, S. In the case where the spatial separation, S, of interconnects 3 is greater than about 1.2 μm, if the distance of the interconnects is long, the spatial capacitance of the interconnects relative to both the horizontal and vertical directions is very small presenting no particular problem particularly when, of course, the thickness of interlayer insulating film 2 is thick.

In the case where the spatial separation, S, of interconnects 3 is about 1.0 μm to 1.2 μm, the spatial capacitance in the vertical direction is still small since it is possible to make the thickness of the interlayer insulating film relative thick, even though the spatial capacitance in the horizontal direction becomes larger.

In the case where the spatial separation, S, of interconnects 3 is about 0.2 μm to 1.0 μm, the spatial separation distance is varied relative to the thickness of interlayer insulating film 2, e.g., as the distance, S, of the interconnects becomes smaller, the thickness of interlayer insulating film 2 correspondingly is made smaller. Accordingly, the spatial capacitance of interconnects 3 relative to the vertical direction becomes proportionately larger with the spatial capacitance of the interconnects in the horizontal direction.

In the case where the spatial separation, S, of interconnects 3 is about 0.2 μm, the spatial capacitance is substantially large. When spatial separation, S, is 0.2 μm, insulating film thickness, $T_I$, becomes 0.1 μm. Since the spatial separation of the interconnects approximates the thickness of the insulating film, the spatial capacitance in both the horizontal and vertical directions becomes extremely large.

Thus, the most desirable value range for the spatial separation, S, of the interconnects is greater than about 0.2 μm and a minimum value of about 0.1 μm is required relative to each the vertical direction and the horizontal direction. Thus, the desired range for spatial separation is within the range of about 0.2 μm to 1.0 μm. In particular, in conjunction with FIG. 3, the following five relationships are established and preferred:

| | |
|---|---|
| 1. The preferred spatial separation, S, of interconnects 3 is 0.2 μm ≦ S ≦ 1.0 μm. | (5) |
| 2. In general, width, L, of interconnects 3 is 0.1 μm ≦ L ≦ 0.8S μm. | (6) |
| 3. The preferred width, L, of interconnects 3 is 0.1 μm ≦ L ≦ 0.5S μm. | (7) |
| 4. The preferred thickness, $T_{A1}$, of interconnects 3 is 0.5L μm ≦ $T_{A1}$ ≦ 2L μm. | (8) |
| 5. The preferred thickness, $T_I$, of interlayer insulating film 2 is 0.5L μm ≦ $T_I$ ≦ 2L μm. | (9) |

The data set forth in Table II shows various examples relative to relationships for interconnect spatial separation, S, width, L, thickness, $T_{A1}$ and thickness, $T_I$, of interlayer insulating film 2. Also, signal switching speed is shown for each sample in relationship to frequency range wherein the symbol "×" represents a switching speed in the range of 10 MHz or less, the symbol " " represents a switching speed in the range of 10 to 20 MHz and the symbol " " represents a switching speed in the range of 20 MHz or more. These symbols in Table II are shown in solid outline in FIG. 3.

TABLE II

| Example No. | S (μm) | L (μm) | Signal Switching Speed | $T_{A1}$ (μm) | $T_I$ (μm) |
|---|---|---|---|---|---|
| 101 | 0.4 | 0.5 | x | 0.25–1.0 | 0.25–1.0 |
| 102 | 0.4 | 0.3 | | 0.15–0.6 | 0.15–0.6 |
| 103 | 0.4 | 0.2 | | 0.1–0.4 | 0.1–0.4 |
| 104 | 0.4 | 0.1 | | 0.05–0.2 | 0.05–0.2 |
| 105 | 0.3 | 0.5 | x | 0.25–1.0 | 0.25–1.0 |
| 106 | 0.3 | 0.3 | | 0.15–0.6 | 0.15–0.6 |

TABLE II-continued

| Example No. | S (μm) | L (μm) | Signal Switching Speed | $T_{A1}$ (μm) | $T_I$ (μm) |
| --- | --- | --- | --- | --- | --- |
| 107 | 0.3 | 0.2 |   | 0.1–0.4 | 0.1–0.4 |
| 108 | 0.3 | 0.1 |   | 0.05–0.2 | 0.05–0.2 |
| 109 | 0.2 | 0.3 | x | 0.15–0.6 | 0.15–0.6 |
| 110 | 0.2 | 0.2 |   | 0.1–0.4 | 0.1–0.4 |
| 111 | 0.2 | 0.1 |   | 0.05–0.2 | 0.05–0.2 |
| 112 | 0.1 | 0.3 | x | 0.15–0.6 | 0.15–0.6 |
| 113 | 0.1 | 0.2 | x | 0.1–0.4 | 0.1–0.4 |
| 114 | 0.1 | 0.1 |   | 0.05–0.2 | 0.05–0.2 |

The most minimum relationship of preferred values is illustrated in Example 111 of Table II. A specific sample in the range set for Example 111 is $S=0.2$ μm, $L=0.1$ μm, $T_{A1}=0.15$ μm and $T_I=0.1$ μm. Other more desirable samples are in the range set for Example 103 of Table II with $S=0.4$ μm, $L=0.2$ μm, $T_{A1}=0.2$ μm and $T_I=0.2$ μm, and for Example 7 of Table I with $S=0.7$ μm, $L=0.3$ μm, $T_{A1}=0.2$ μm and $T_I=0.2$ μm.

With reference to the data in Table II, the following information should be appreciated. If a semiconductor integrated circuit is reduced in scale, the spatial capacitance of interconnects 3 will increase, bringing about a significant deterioration in circuit signal switching speed. If the spatial separation, S, of interconnects 3 is in the sub-micron range, the thickness, $T_I$, of interlayer insulating film 4 has to be correspondingly thinner because of, for example, the processing requirements for contact holes, i.e., the amount etched film depth in relation to its lateral extension is directly related to the thickness of film. Accordingly, if the width, L, of interconnects 3 is not reduced with a corresponding reduction of the spatial separation, S, of interconnects 3, spatial capacitance in the vertical direction will significantly increase so that the ratio value of L/S must be appropriate, e.g., 0.8 or less and, preferably 0.5 or less. It should be noted that the ratio value of L/S=1 corresponds to a signal switching speed of 10 MHz or less, L/S=0.8 corresponds to a signal switching speed of 10 MHz to 20 MHz and L/S=0.5 corresponds to a signal switching speed of 20 MHz or more.

Thus, with a miniaturization or decrease in width, L, of interconnects 3, the thickness, $T_I$, of interlayer insulating film 2 should also correspondingly be decreased. The minimum value for $T_I$ is then 0.05 μm and the minimum value for width, L, is 0.1 μm from the relationship (9), i.e., $0.5 L \mu m \leq T_I \leq 2 L \mu m$. On the other hand, the signal switching speed is determined by the value of L/S and the maximum desired value of width, L, which is 0.8 S with a more preferred value being 0.5 S.

Further, relative to spatial separation, S, of interconnects 3, in order to maximize circuit signal switching speed, the minimum value of width, L, of interconnects 3 is 0.1 μm, per relationship (6), and the minimum value of spatial separation, S, is 0.2 μm, per the relationship (5). The maximum value of spatial separation, S, is a value in which the spatial capacitance in the vertical direction is sufficient value to present a problem for practical circuit applications which is about 1.0 μm.

Further, relative to the thickness, $T_{A1}$, of interconnects 3, the larger the value for $T_{A1}$, the smaller the electrical resistance of the interconnect, which is, of course, a desirable feature. However, the preferred maximum value of thickness, $T_{A1}$, is 2 L μm since $T_{A1}$ renders the spatial capacitance smaller in the horizontal direction and also due to the limitations of etching. The minimum value of $T_{A1}$ is 0.5 L μm since the electrical resistance is a desirably small value.

Further, relative to the thickness, $T_I$, of interlayer insulating film 2, the maximum value for $T_I$ depends on whether etching can be achieved to produce appropriate contact holes in the film so that the determined value thereof is 2 L μm. Since the minimum value for $T_I$ renders the spatial capacitance in the vertical direction small, the determined value thereof is 0.5 L μm.

In summary, when the interconnect width is in the sub-micron range, the circuit operation speed delay brought about an increase of the interconnect capacitance associated with scaling of the interconnect spatial separation is dominant or much larger compared to the increase of interconnect resistance associated with interconnect width scaling. Thus, the increase of circuit delay associated with design rule scaling can be avoided by employing the interconnect layout rule of this invention wherein the interconnect spatial separation, S, comparatively is significantly larger (S>L) than the interconnect width according to the general relationship $0.1 \mu m \leq L \leq 0.8 S \mu m$.

While the invention has been described in conjunction with a embodiment, it is evident to those skilled in the art that many further alternatives, modifications and variations will be apparent in light of the forgoing description. Thus, the invention described herein is intended to embrace at such alternatives, modifications, applications and variations as fall within the spirit and scope of the appended claims.

What is claimed is:

1. An integrated circuit structure in the sub-micron integration scale regime, patterned thin film metal interconnects formed in said structure in a manner to optimize the overall reduction in spatial capacitance between interconnects, said interconnects patterned to have a width, L, in the range of $0.1 \mu m \leq L \leq 0.8 \mu m$, a spatial separation, S, in the range of $0.2 \mu m \leq S \leq 1.0 \mu m$, and having a thickness, $T_{A1}$, equal to or less than 2 L, and providing optimized reduction in interconnect spatial capacitance and resistance resulting in increased operation speed of the integrated circuit structure.

2. The integrated circuit structure of claim 1 wherein said structure includes an interlayer insulating film contiguous with said patterned thin film metal interconnects, the thickness, $T_I$, of said insulating film in the range of $0.5 L \mu m \leq S \leq 2 L \mu m$.

3. The integrated circuit structure of claim 1 wherein said structure is included in an apparatus.

4. The integrated circuit structure of claim 1 wherein L is in the range of $0.1 \mu m \leq L \leq 0.8 S \mu m$ and $T_{A1}$ is in the range of $0.5 L \mu m \leq T_{A1} \leq 2 L \mu m$.

5. The integrated circuit structure of claim 4 wherein said structure is included in an apparatus.

* * * * *